United States Patent
Elbel et al.

(10) Patent No.: US 6,551,902 B1
(45) Date of Patent: Apr. 22, 2003

(54) PROCESS FOR FABRICATING A BURIED, LATERALLY INSULATED ZONE OF INCREASED CONDUCTIVITY IN A SEMICONDUCTOR SUBSTRATE

(75) Inventors: Norbert Elbel, München (DE); Zvonimir Gabric, Zorneding (DE); Bernhard Neureither, Hoehenkirchen (DE)

(73) Assignee: Infineon Technologies AG, Munich (DE)

( * ) Notice: Subject to any disclaimer, the term of this patent is extended or adjusted under 35 U.S.C. 154(b) by 288 days.

(21) Appl. No.: 09/237,174

(22) Filed: Jan. 25, 1999

Related U.S. Application Data

(63) Continuation of application No. PCT/DE97/01542, filed on Jul. 22, 1997.

(30) Foreign Application Priority Data

Jul. 23, 1996  (DE) .......................................... 196 29 766

(51) Int. Cl.[7] ............................................... H01L 21/76
(52) U.S. Cl. ...................................................... 438/425
(58) Field of Search ................................. 438/224, 225, 438/424, 425

(56) References Cited

U.S. PATENT DOCUMENTS

| | | | |
|---|---|---|---|
| 4,472,240 A | | 9/1984 | Kameyama |
| 4,551,911 A | * | 11/1985 | Sasaki et al. ............... 438/424 |
| 5,491,108 A | | 2/1996 | Suzuki et al. |
| 5,536,675 A | | 7/1996 | Bohr |
| 5,872,043 A | * | 2/1999 | Chen .......................... 438/424 |

FOREIGN PATENT DOCUMENTS

| | | |
|---|---|---|
| DE | 42 11 050 A1 | 10/1993 |
| EP | 0 537 001 A1 | 4/1993 |
| EP | 0 582 724 A1 | 2/1994 |
| EP | 0 647 968 A2 | 4/1995 |

OTHER PUBLICATIONS

Japanese Patent Abstract No. 05218031 (Tsukasa), dated Aug. 27, 1993.

* cited by examiner

*Primary Examiner*—Carl Whitehead, Jr.
*Assistant Examiner*—David S Blum
(74) *Attorney, Agent, or Firm*—Laurence A. Greenberg; Werner H. Stemer; Gregory L. Mayback

(57) ABSTRACT

A laterally insulated buried zone of increased conductivity is fabricated in a semiconductor substrate. First, a reference layer is formed on a substrate with a buried zone of increased conductivity. Then the reference layer is patterned. A trench is produced in the substrate, and the insulation material used for filling the trench is applied to the structure thus produced. A planar surface is thereby formed in that the growth rate in the trench is faster than the growth rate on the reference layer adjacent the trench. Here, the reference layer is chosen such that the growth rate of the insulation material on the reference layer is at least a factor of two less than the growth rate of the insulation material on the surface of the trench which is to covered. This trench surface to be covered will usually be composed of substrate material. However, intermediate layers may also be provided.

11 Claims, 2 Drawing Sheets

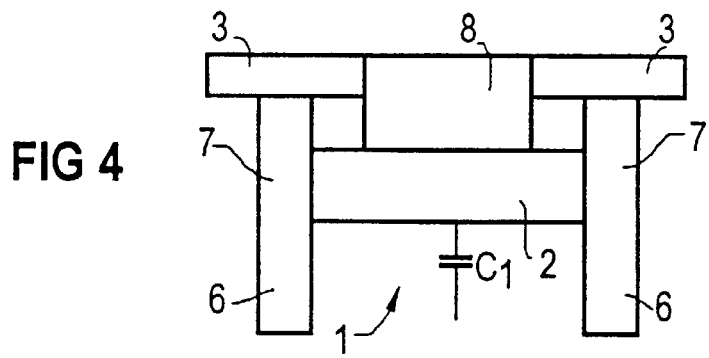
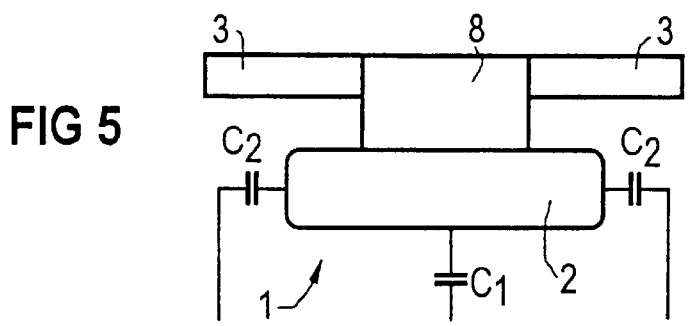
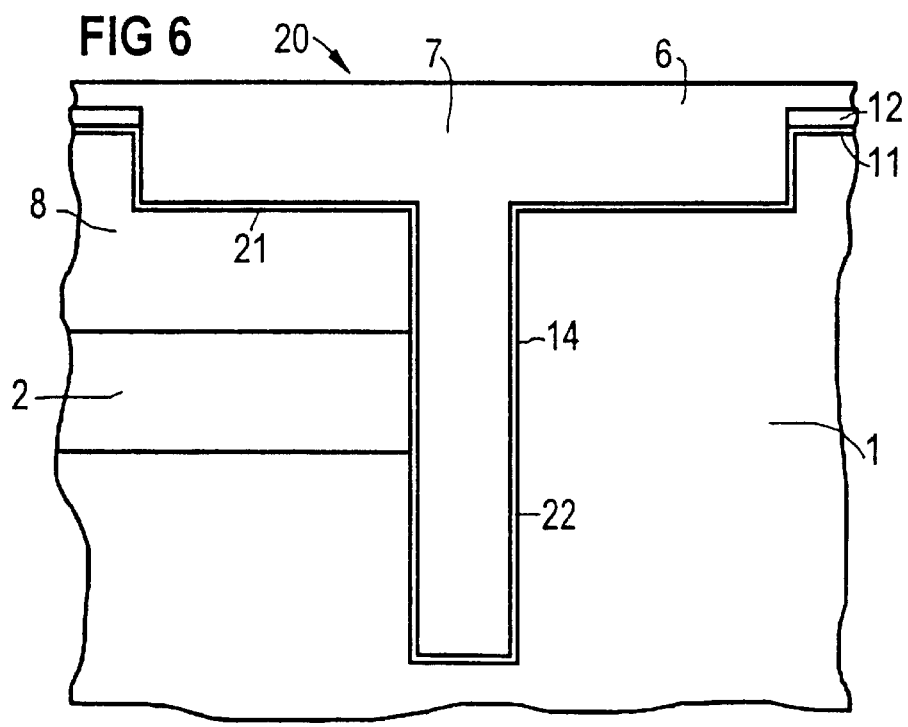

PROCESS FOR FABRICATING A BURIED, LATERALLY INSULATED ZONE OF INCREASED CONDUCTIVITY IN A SEMICONDUCTOR SUBSTRATE

CROSS-REFERENCE TO RELATED APPLICATION

This application is a continuation of copending International application No. PCT/DE97/01542, filed Jul. 22, 1997, which designated the United States.

BACKGROUND OF THE INVENTION

Field of the Invention

The invention lies in the field of semiconductor manufacture. More specifically, the invention relates to a process for fabricating a buried, laterally insulated zone of increased conductivity in a semiconductor substrate. The invention relates, in particular, to a process for fabricating a buried, laterally insulated zone of increased conductivity in a semiconductor substrate by means of deep trench insulation.

Buried zones of increased conductivity, so-called "buried layers," are used in a large number of components appertaining to semiconductor technology in order to enable lateral contact to be made with the components. Thus, in radio-frequency technology, for example, the "buried layer" is part of the collector in a vertical bipolar transistor.

In order that neighboring components on a chip do not interfere with one another's operation, it is necessary for the components to be insulated from one another by insulation structures. If two neighboring components each have a "buried layer," then those "buried layers" must also be insulated from one another.

The simplest option for insulation of this type consists in leaving sufficient space between the individual zones of increased conductivity, so that the individual zones are insulated from one another by the substrate. In addition, a further implantation ("channel stopper") is inserted between the individual zones of increased conductivity, which further implantation produces a blocking PN junction.

However, this option has the disadvantage that the packing density of the component is severely limited as a result. Furthermore, it has been found that in applications in radio-frequency technology, the cut-off frequency of the bipolar transistors which can be achieved is limited by the capacitance which forms between the zone of increased conductivity and the substrate. In order to be able to achieve cut-off frequencies of greater than 50 GHz, this zone-substrate capacitance must be significantly reduced.

In order to solve this problem, deep oxide-filled trenches ("deep trenches") have been proposed which completely surround each zone of increased conductivity in the form of a closed ring. However, a series of difficulties arise particularly in the course of planarizing the oxide-filled trenches. Large topological differences are produced on the surface of the semiconductor wafer as a result of the filling of the trenches. Those differences can have a disruptive effect on subsequent process steps. The consequence of this is that the topological differences have to be removed again by means of planarization, for example etching back. However, planarization by etching back requires complex and expensive process control particularly when LOCOS insulation is simultaneously used on the substrate surface.

SUMMARY OF THE INVENTION

It is accordingly an object of the invention to provide a novel process for fabricating a buried, laterally insulated zone of increased conductivity in a semiconductor substrate, which overcomes the above-mentioned disadvantages of the heretofore-known devices and methods of this general type and which operates economically with little outlay in terms of time and cost and which enables a patterned substrate having optimum planarity.

With the foregoing and other objects in view there is provided, in accordance with the invention, a process for fabricating a buried, laterally insulated zone of increased conductivity in a semiconductor substrate, having the following steps:

providing a substrate with a buried zone of increased conductivity;

forming a reference layer on the substrate;

patterning the reference layer;

forming a trench in the substrate; and filling the trench with insulation material and depositing the insulation material on the structure thus produced;

selecting a material of the reference layer such that a growth rate of the insulation material on the reference layer is at least by a factor of two less than a growth rate of the insulation material on a surface of the trench to be covered.

The trench surface to be covered will usually be composed of substrate material. However, intermediate layers may also be provided.

The buried, laterally insulated zones of increased conductivity produced by the process according to the invention can be packed more densely, as a result of which it is possible to produce a higher integration level on the semiconductor wafers. Furthermore, the capacitance formed between the zones of increased conductivity and the substrate is significantly reduced, as a result of which it is possible to obtain higher cut-off frequencies in radio-frequency technology. The process according to the invention enables the zones of increased conductivity to be insulated without large topological differences being built up on the surface of the substrate.

In accordance with an added feature of the invention, the substrate is a silicon substrate and the insulation material for filling the trench is silicon oxide.

In accordance with an additional feature of the invention, the reference layer is silicon nitride layer, a titanium nitride layer, or a polysilicon layer. If the reference layer is polysilicon, it is in particular a doped polysilicon layer. The silicon oxide is advantageously deposited in an ozone-activated CVD process, in particular SACVD process. Such ozone-activated CVD processes are described in detail in the European specifications EP 0 582 724 A1 and EP 0 537 001 A1, for example. In particular an SACVD deposition process is distinguished by very good filling properties, which means that even trenches having a large aspect ratio of greater than 2:1 can be filled without the formation of shrink holes.

In accordance with a further feature of the invention, the filling/depositing step is continued until a substantially planar surface is formed in the surroundings of the trench.

The reference layer can be applied directly to the substrate surface. Alternatively, however, in accordance with again an added feature of the invention, at least one intermediate layer is formed between the substrate and the reference layer. In a preferred embodiment, the intermediate layer is an oxide layer (LOCOS oxide, pad oxide).

In accordance with again an additional feature of the invention, thermal oxidation is carried out subsequently to the filling and depositing steps. The thermal oxidation may be at 900–1000° C. for 10–30 minutes. The oxidation acts through the material already deposited, in particular through the silicon oxide already deposited, and reduces damage which has remained in the substrate and may have occured during the production of the trench.

In the alternative, a liner oxidation process is carried out subsequently to the step of forming the trench. Damage in the substrate can also be reduced by the liner oxidation. However, the oxide which has grown on must subsequently be removed by wet-chemical means since otherwise the selectivity of the subsequent deposition process is not provided. This "sacrificial oxide" removes for example etching damage and stationary charges at the edge of the trench, which would impair the insulation properties of the trench.

In accordance with again another feature of the invention, the insulation material is removed from above a level of the reference layer after the filling and depositing step. A wet-chemical or plasma-chemical process is advantageously used for this purpose.

In accordance with again a further feature of the invention, the zone of increased conductivity is located at a given depth in the substrate, and wherein the trench is formed into the substrate to a depth below the zone of increased conductivity.

In accordance with yet another feature of the invention, the trench is an annular trench disposed laterally of and completely enclosing at least a part of the zone of increased conductivity.

Usually, the individual components are additionally insulated from one another on the substrate surface by means of a field oxide, in particular a LOCOS oxide. Therefore, it is particularly preferred if the trench has at least one shallow region and at least one deep region. In this way, the shallow region of the trench can replace the field oxide on the substrate surface and a well-planarized substrate surface is obtained.

In accordance with a concomitant feature of the invention, the insulation material is removed from above a level of the reference layer by a CMP process. Since, in the case of using the shallow trenches, the wafer surface is already essentially planar before a subsequent CMP step, no appreciable "dishing" occurs during a CMP step even in the case of large trench regions.

In accordance with yet again a further feature of the invention, a ratio of a width of the deep region to a step height of the shallow region is approximately equal to $2*\alpha/(\alpha-1)$, where $\alpha$ corresponds to a ratio of the growth rate of the insulation material on the surface of the trench to be covered to the growth rate of the insulation material on the reference layer. As a result, the two regions of the trench can be filled in a simple manner such that a planar surface of the deposited insulation material is produced.

Although the invention is illustrated and described herein as embodied in process for fabricating a buried, laterally insulated zone of increased conductivity in a semiconductor substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is a schematic view of a component structure produced by the process according to the invention;

FIG. 5 is a schematic view of a component structure according to the prior art; and FIG. 6 is a partial diagrammatic view of a further component structure produced by the process according to the invention.

DESCRIPTION OF THE PREFERRED EMBODIMENTS

Figure 1:
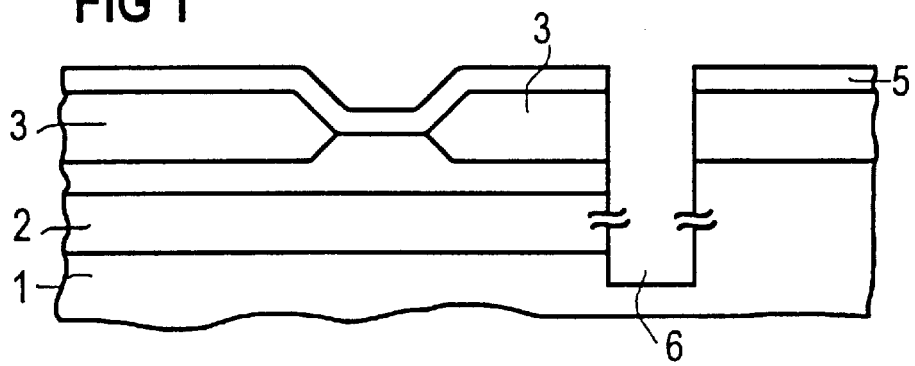
FIGS. 1 to 3 are partial diagrammatic elevational views illustrating the process according to the invention.

Referring now to the figures of the drawing in detail and first, particularly, to FIG. 1 thereof, there is seen a silicon substrate 1. A zone 2 of increased conductivity ("buried layer") has been produced in the substrate 1 by means of implantation, for example. Also situated on the surface of the substrate 1 is a field oxide insulation 3 (LOCOS oxide), which insulates different components and/or different parts of a component from one another.

A silicon nitride layer 5 is applied to the surface of the substrate 1 and of the field oxide 3. The silicon nitride layer 5 serves as a reference layer for the subsequent trench filling. The nitride layer ($Si_3N_4$) is fabricated using a CVD process.

Subsequently, the silicon nitride layer is patterned using a photographic technique and the trench 6 is anisotropically etched. The trench 6 is etched into the silicon substrate 1 to a depth of about 5 $\mu$m and has a width of 1 $\mu$m The resultant structure is shown in FIG. 1.

Figure 2:
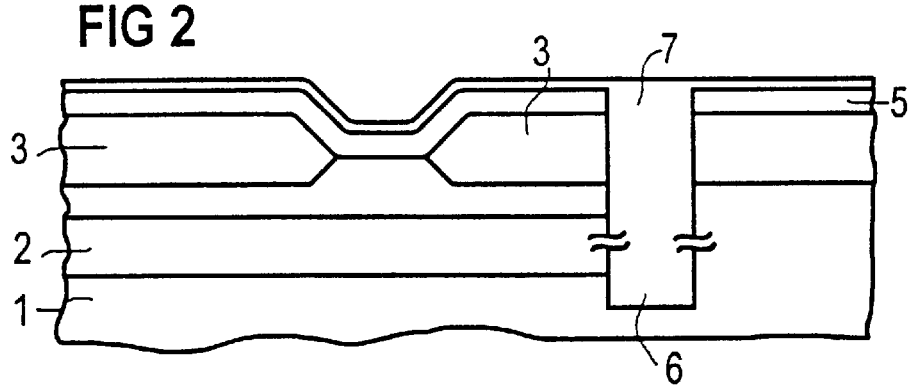

Referring now to FIG. 2, the trench 6 is subsequently filled with silicon oxide 7. The filler material is deposited using an ozone-activated CVD process.

In the course of the ozone-activated deposition of silicon oxide layers, it is possible for different growth rates to be obtained on differently configured surfaces. In the present case, the growth rate of silicon oxide on the nitride layer 5 is a factor of 5 less than the growth rate of silicon oxide on the silicon and the silicon oxide of the trench 6. The oxide deposition is carried out until an essentially planar oxide surface is established in the local surroundings of the trench 6.

Suitable starting substances for the CVD deposition are, in addition to TEOS, in particular OMTC (octa-methyl-cyclo-tetra-siloxane) and HMDS (hexa-methyl-disiloxane).

Figure 3:
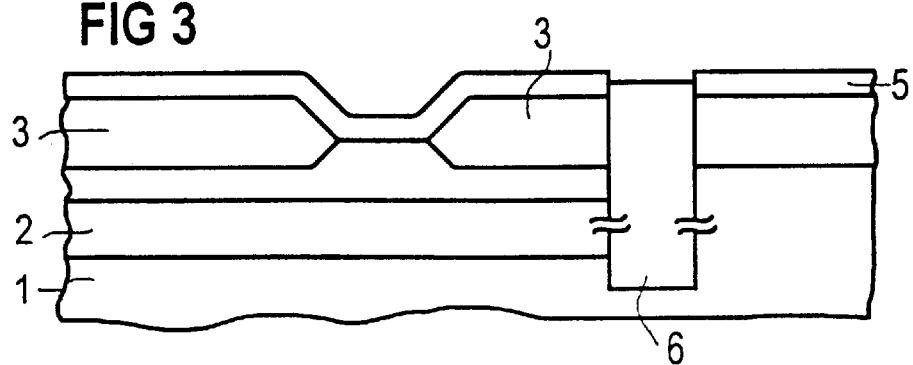

Referring now to FIG. 3, the silicon oxide 7 that was arranged over the upper edge of the nitride layer 5, and that had been deposited by means of the ozone-activated CVD process, is subsequently removed. This is preferably done by an etch-back process.

FIG. 4 shows a component structure produced by the process according to the invention. The component structure comprises a zone 2 of increased conductivity which is surrounded by an annularly closed trench 6.

The trench 6 is filled with silicon oxide 7 and insulates the zone 2 of increased conductivity in the lateral direction. Consequently, an appreciable capacitance C1 is formed between the zone 2 and the substrate only at the underside of the zone 2. Arranged above the zone 2 is the actual component 8, which is additionally insulated by a field oxide 3 on the surface of the substrate.

In comparison with this, FIG. 5 shows a component structure according to the prior art. In this case, the zone 2 is insulated from other components (not shown) only by the substrate 1, if appropriate with an additional "channel stopper" implantation. In addition to the capacitance C1 at the underside of the zone 2, a further capacitance C2 is then formed at the lateral sides of the zone 2. This increases the total capacitance between the zone 2 and the substrate 1 and leads to limitation of the cut-off frequency that can be achieved in the case of applications in radio-frequency technology.

FIG. 6 shows a further component structure produced by the process according to the invention. The insulation structure 20 comprises a trench 6 filled with silicon oxide 7 in a semiconductor substrate 1. Furthermore, the insulation structure 20 has a shallow region 21, which has a step height T from the surface of a silicon nitride layer 12 (reference layer). Furthermore, the insulation structure 20 has a deep region 22. This deep region 22 laterally insulates the zone 2 of increased conductivity which is formed in the substrate 1. The actual component 8 is once again arranged above the zone 2. In addition, a thin pad oxide 11 is arranged between the silicon nitride layer 12 (reference layer) and the substrate.

The region 22 of the insulation structure 20 has the width B. In this case, the ratio of the width B of the deep region to the step height T of the shallow region is approximately equal to $2*\alpha/(\alpha-1)$, where $\alpha$ corresponds to the ratio of the growth rate of the filler material (the material used for filling the trench) on the substrate 1 to the growth rate of the material used for filling the trench on the nitride layer 12.

As a result, it is ensured that a virtually planar surface of the silicon oxide 7 is produced in the course of filling the insulation structure according to the invention.

The shallow region 21 of the trench 6 replaces the field oxide 3 (see FIGS. 1 to 3) on the substrate surface. In contrast to a field oxide 3 which has been produced by a LOCOS process, the shallow region 21 of the trench 6 has good planarity. Larger process windows, for example for subsequent lithography steps, are obtained as a result. In this case, the silicon oxide 7 projecting beyond the reference layer 12 can also be removed by a CMP (chemical mechanical polishing) process.

We claim:

1. A process for fabricating a buried, laterally insulated zone of increased conductivity in a semiconductor substrate, having the following steps:

providing a silicon substrate with a buried zone of increased conductivity;

forming a reference layer on the substrate;

patterning the reference layer;

forming a trench with at least one shallow region and at least one deep region in the substrate; and filling the trench with silicon oxide insulation material and depositing the insulation material on the structure thus produced in an ozone-activated CVD process;

selecting a material of the reference layer such that a growth rate of the insulation material on the reference layer is at least by a factor of two less than a growth rate of the insulation material on a surface of the trench to be covered, a ratio of a width of the deep region to a step height of the shallow region being approximately equal to $2*\alpha/(\alpha-1)$, where $\alpha$ corresponds to a ratio of the growth rate of the insulation material on the surface of the trench to be covered to the growth rate of the insulation material on the reference layer.

2. The process according to claim 1, wherein the reference layer is a layer selected from the group consisting of a silicon nitride layer, a titanium nitride layer, and a polysilicon layer.

3. The process according to claim 1, wherein the filling step is continued until a substantially planar surface is formed in the surroundings of the trench (6).

4. The process according to claim 1, which comprises forming at least one intermediate layer between the substrate and the reference layer.

5. The process according to claim 4, wherein the intermediate layer is an oxide layer.

6. The process according to claim 1, which further comprises carrying out thermal oxidation subsequently to the filling and depositing steps.

7. The process according to claim 1, which further comprises carrying out a liner oxidation process subsequently to the step of forming the trench.

8. The process according to claim 1, which further comprises, after the filling and depositing step, removing the insulation material from above a level of the reference layer.

9. The process according to claim 1, wherein the zone of increased conductivity is located at a given depth in the substrate, and wherein the trench is formed into the substrate to a depth below the zone of increased conductivity.

10. The process according to claim 1, wherein the trench is an annular trench disposed laterally of and completely enclosing at least a part of the zone of increased conductivity.

11. The process according to claim 1, which further comprises removing the insulation material from above a level of the reference layer by a CMP process.

* * * * *